(12) United States Patent
Lee et al.

(10) Patent No.: US 10,546,755 B2
(45) Date of Patent: Jan. 28, 2020

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Chen-Ming Lee, Yangmei (TW); Fu-Kai Yang, Hsinchu (TW); Mei-Yun Wang, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/129,741

(22) Filed: Sep. 12, 2018

(65) Prior Publication Data
US 2019/0013208 A1 Jan. 10, 2019

Related U.S. Application Data

(62) Division of application No. 15/649,909, filed on Jul. 14, 2017, now Pat. No. 10,121,675.
(Continued)

(51) Int. Cl.
*H01L 27/088* (2006.01)
*H01L 21/311* (2006.01)
(Continued)

(52) U.S. Cl.
CPC .. *H01L 21/31116* (2013.01); *H01L 21/31144* (2013.01); *H01L 21/76834* (2013.01);
(Continued)

(58) Field of Classification Search
CPC ......... H01L 21/31116; H01L 21/31144; H01L 21/76834; H01L 21/76837;
(Continued)

(56) References Cited

U.S. PATENT DOCUMENTS

| 7,268,058 B2 * | 9/2007 | Chau ................ H01L 29/66795 |
| | | 257/E21.442 |
| 8,772,109 B2 | 7/2014 | Colinge |

(Continued)

FOREIGN PATENT DOCUMENTS

| KR | 10-2016-0019276 A | 2/2016 |
| KR | 10-2016-0142198 A | 12/2016 |

(Continued)

OTHER PUBLICATIONS

Office Action issued in related U.S. Appl. No. 15/649,909, dated Feb. 5, 2018.

(Continued)

*Primary Examiner* — Tu-Tu V Ho
(74) *Attorney, Agent, or Firm* — McDermott Will & Emery LLP

(57) ABSTRACT

A semiconductor device includes: an isolation insulating layer; fin structures protruding from the isolation insulating layer; gate structures, each having a metal gate and a cap insulating layer disposed over the metal gate; a first source/drain epitaxial layer and a second source/drain epitaxial layer disposed between two adjacent gate structures; and a first conductive contact disposed on the first source/drain epitaxial layer, and a second conductive contact disposed on the second source/drain epitaxial layer; a separation isolation region disposed between the first and second conductive contact; and an insulating layer disposed between the separation isolation region and the isolation insulating layer. The separation isolation region is made of a different material than the insulating layer.

20 Claims, 11 Drawing Sheets

Related U.S. Application Data

(60) Provisional application No. 62/440,146, filed on Dec. 29, 2016.

(51) Int. Cl.
*H01L 29/78* (2006.01)
*H01L 29/66* (2006.01)
*H01L 21/8234* (2006.01)
*H01L 21/768* (2006.01)
*H01L 21/8238* (2006.01)
*H01L 27/092* (2006.01)

(52) U.S. Cl.
CPC .. *H01L 21/76837* (2013.01); *H01L 21/76897* (2013.01); *H01L 21/823431* (2013.01); *H01L 21/823468* (2013.01); *H01L 21/823475* (2013.01); *H01L 21/823821* (2013.01); *H01L 27/0886* (2013.01); *H01L 27/0924* (2013.01); *H01L 29/6656* (2013.01); *H01L 29/66795* (2013.01); *H01L 29/785* (2013.01); *H01L 29/7853* (2013.01); *H01L 21/31111* (2013.01); *H01L 21/823425* (2013.01)

(58) Field of Classification Search
CPC ....... H01L 21/76897; H01L 21/823431; H01L 21/823468; H01L 21/823475; H01L 21/823821; H01L 21/31111; H01L 21/823425; H01L 27/0886; H01L 27/0924; H01L 29/6656; H01L 29/66795; H01L 29/785; H01L 29/7853
USPC ...................................................... 257/401
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,947,657 B2 | 4/2018 | Chen et al. |
| 2005/0156171 A1 | 7/2005 | Brask et al. |
| 2014/0042502 A1* | 2/2014 | Xie .................. H01L 29/78 257/288 |
| 2014/0248761 A1* | 9/2014 | Park ............. H01L 21/823871 438/586 |
| 2016/0043170 A1* | 2/2016 | Park ................ H01L 27/0886 257/369 |
| 2016/0268415 A1 | 9/2016 | Labonte et al. |
| 2016/0358925 A1 | 12/2016 | Bai et al. |
| 2017/0271336 A1 | 9/2017 | Park et al. |

FOREIGN PATENT DOCUMENTS

| | | |
|---|---|---|
| TW | 201543675 A | 11/2015 |
| TW | 201543676 A | 11/2015 |
| TW | 201545341 A | 12/2015 |

OTHER PUBLICATIONS

Notice of Allowance issued in related U.S. Appl. No. 15/649,909, dated May 23, 2018.
Office Action issued in corresponding Korean Patent Application No. 10-2017-0125203, dated Aug. 13, 2018.

* cited by examiner

SEMICONDUCTOR DEVICE AND A METHOD FOR FABRICATING THE SAME

CROSS-REFERENCE TO RELATED APPLICATIONS

This application is a Divisional of U.S. patent Ser. No. 15/649,909, filed on Jul. 14, 2017, now U.S. patent Ser. No. 10/083,841, which claims priority to U.S. Provisional Patent Application 62/440,146 filed Dec. 29, 2016, the entire disclosure of each of which is incorporated herein by reference.

TECHNICAL FIELD

The disclosure relates to a method for manufacturing a semiconductor device, and more particularly to a structure and a manufacturing method for a conductive layer over a gate, source/drain regions and/or a substrate.

BACKGROUND

With a decrease of dimensions of semiconductor devices, a separation or insulation between conductive layers becomes more important, while lowering resistance, for example, contact resistance becomes more important.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Because a gate-to-gate space (<10 nm) becomes smaller and smaller, etching of an interlayer dielectric (ILD) layer between two source/drain (SD) epitaxial layers becomes a key process beyond the 5-nm node. A self-aligned contact (SAC) process in a dry etching process, using polymers to increase an etch selectivity of the ILD layer (e.g., $SiO_2$) to the cap insulating layer (e.g., $Si_3N_4$) of the metal gate (MG). There is trade-off between an ILD layer etching-through capability and a loss of the MG cap layer and sidewall spacers. When the ILD etching-through capability is increased, the etching amount of the MG cap layer and the sidewall spacers increase, and a portion of the MG cap layer and sidewall spacers is removed. In the present embodiments, the operations and the structures to increase an etching selectivity when forming a contact through the ILD layer are provided.

Figure 1A:
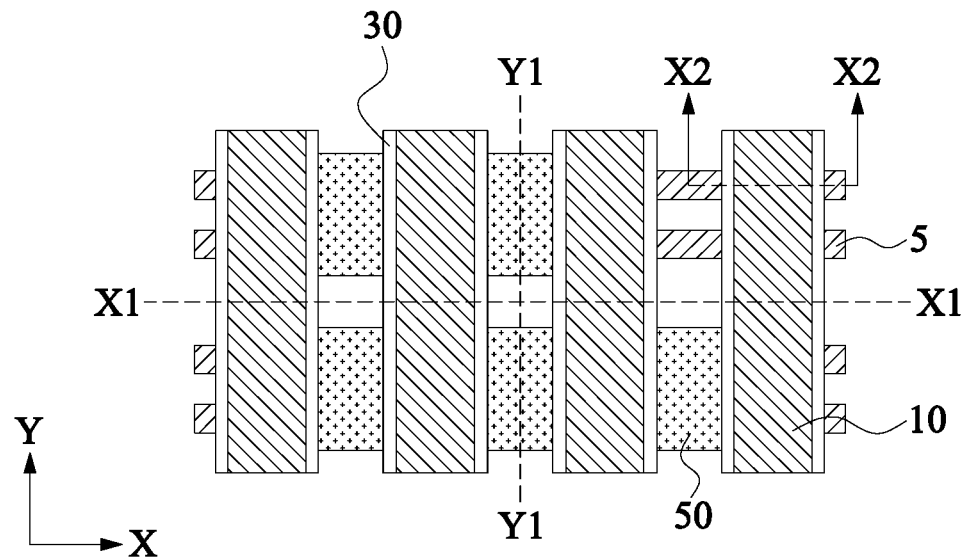
FIG. 1A shows a plan view of a semiconductor device.
Figure 1B:
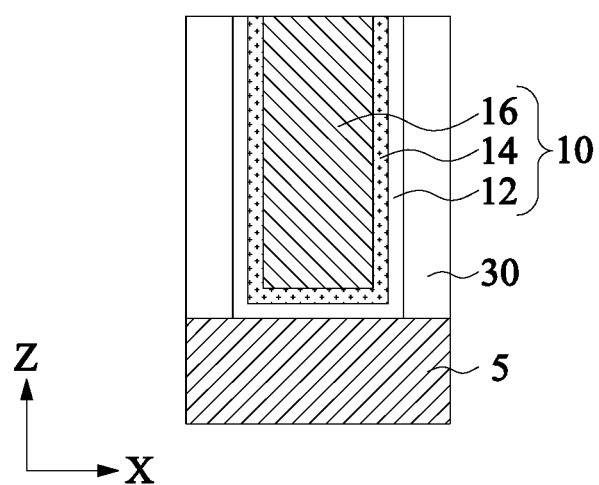
FIG. 1B is a cross sectional view of a gate structure of the semiconductor device and FIG. 1C is a perspective view of the semiconductor device, according to embodiments of the present disclosure.
Figure 1C:
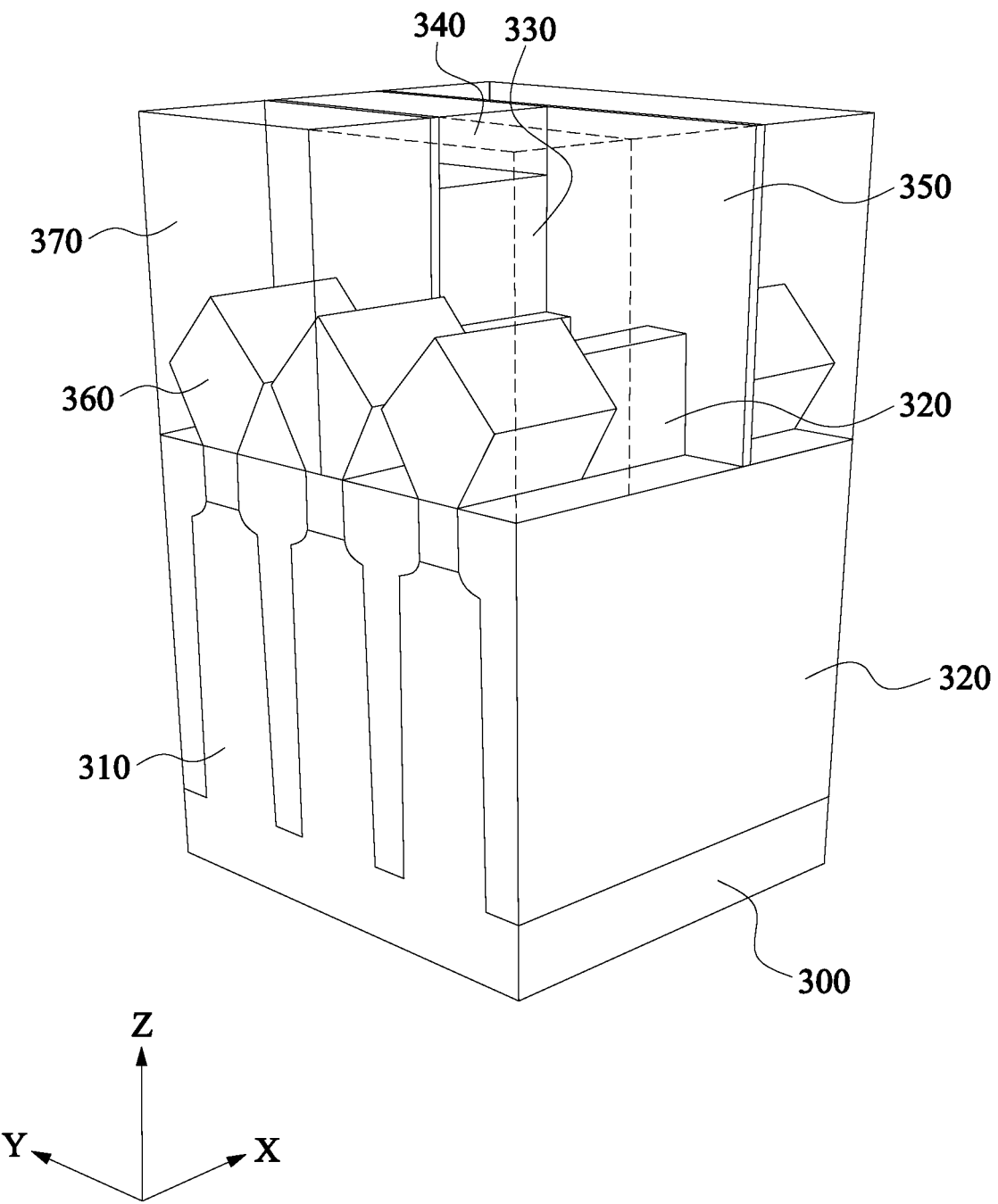

FIG. 1A shows a plan view of a semiconductor device, FIG. 1B is a cross sectional view, corresponding to line X2-X2 of FIG. 1A, of a gate structure of the semiconductor device and FIG. 1C is a perspective view of the semiconductor device, according to embodiments of the present disclosure.

FIGS. 1A-1C show structures of a semiconductor fin field effect transistor (FinFET) device after metal gate structures and a first interlayer dielectric (ILD) layer are formed. Fin structures 5 made of, for example Si, are disposed and extend in the X direction. Metal gate structures 10 extend in the Y direction and source/drain (S/D) epitaxial layers 50 are disposed between the adjacent metal gates. In FIG. 1A, some of the fin structures are exposed between the metal gate structures 10 without an S/D epitaxial layer 50, but the present embodiments are not limited to this configuration.

The metal gate structures 10 are formed over one or more channel layers, for example, a part of fin structures 5. The fin structures 5 are disposed over a substrate and protrude from an isolation insulating layer (e.g., shallow trench isolation (STI)) 15 (see, FIG. 2A). In FIG. 1A, four fin structures 5 are disposed along the Y direction and four metal gate structures 10 are disposed along the X direction. However, the number of the fin/gate structures is not limited to four.

Sidewall spacers 30 are provided on sidewalls of the metal gate structure 10. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10 and sidewall spacers 30 may be collectively referred to as a gate structure. Further, S/D epitaxial regions 50 are formed adjacent to the gate structures.

Figure 2A:
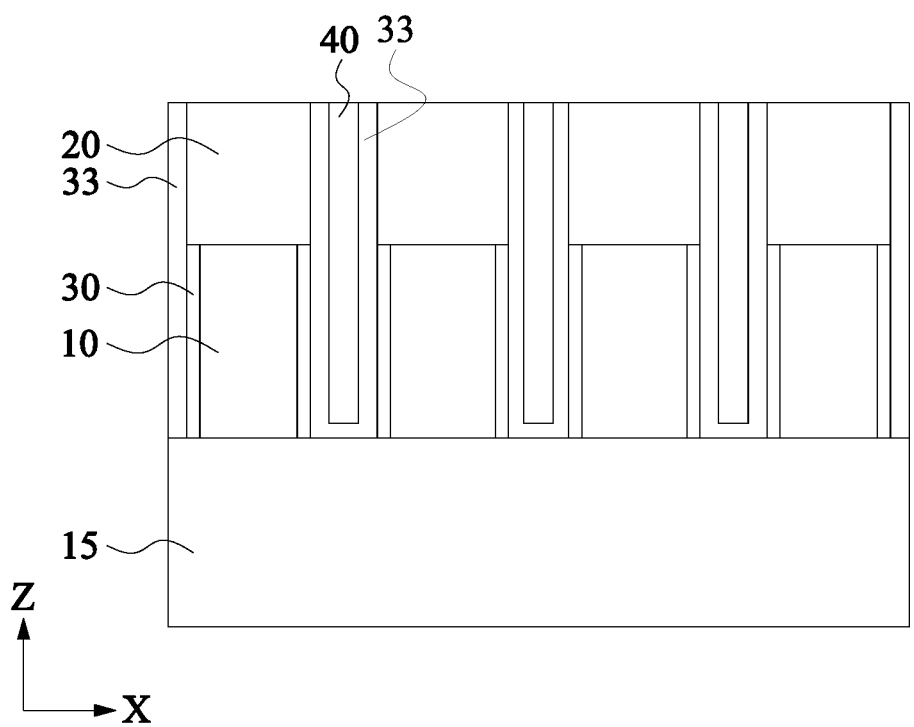
FIG. 2A shows one of the various stages of a sequential manufacturing operation for a semiconductor device according to embodiments of the present disclosure.
Figure 2B:
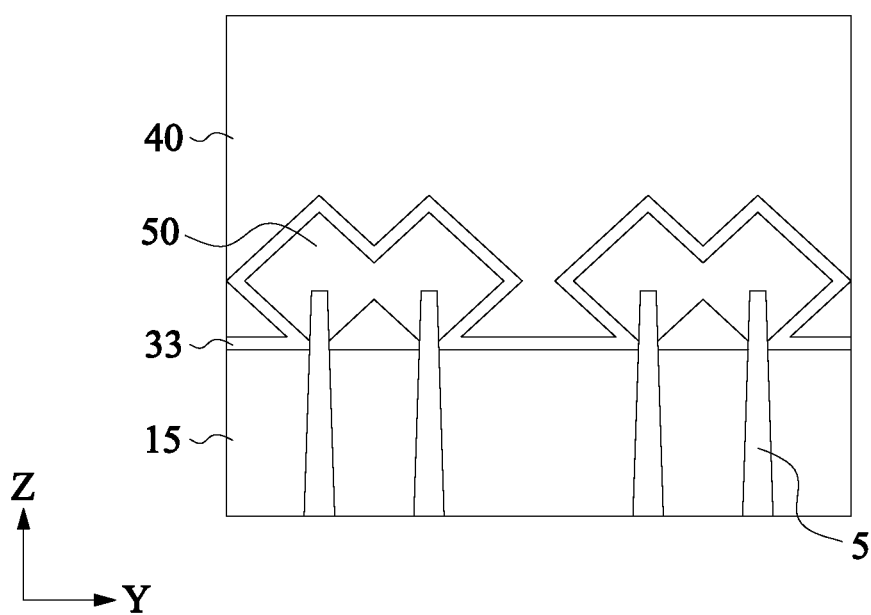
FIG. 2B shows one of the various stages of a sequential manufacturing operation for a semiconductor device according to embodiments of the present disclosure.

Spaces between the gate structures are filled with a first interlayer dielectric (ILD) layer 40 (see, FIGS. 2A and 2B). In the present disclosure, a source and drain are interchangeably used and there is substantially no structural difference. The term "a source/drain" (an S/D) refers to one of a source and a drain.

FIG. 1B is an enlarged cross sectional view of the metal gate structure. The metal gate structure 10 includes one or more layers 16 of metal material, such as Al, Cu, W, Ti, Ta, TiN, TiAl, TiAlC, TiAlN, TaN, NiSi, CoSi, or any other suitable conductive materials. A gate dielectric layer 12 disposed between the channel layer 5 and the metal gate structure includes one or more layers of metal oxide such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof, or any other suitable dielectric material. In some embodiments, an interfacial layer made of $SiO_2$ having a 1-3 nm thickness is formed between the channel layer 5 and the high-k gate dielectric layer 12.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials, or any other suitable conductive material. For the n-channel FET, one or more of TaN, TaAlC, TiN, TiC, Co, TiAl, HfTi, TiSi and TaSi, or any other suitable conductive material is used as the work function adjustment layer, and for the p-channel FET, one or more of TiAlC, Al, TiAl, TaN, TaAlC, TiN, TiC and Co, or any other suitable conductive material is used as the work function adjustment layer.

In this embodiment, fin field effect transistors (Fin FETs) fabricated by a gate-replacement process are employed. However, the technologies disclosed herein can be applied to other electronic devices, such as a planar FET, a gate-all-around FET, a multi-gate FET, a capacitor, a diode and a resistor.

FIG. 1C shows a perspective view of a FinFET structure according to embodiments of the present disclosure. The Fin FET structure can be fabricated by the following operations.

First, a fin structure 310 is fabricated over a substrate 300. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

The fin structure includes a bottom region and an upper region as a channel region 315. The substrate is, for example, a p-type silicon substrate with an impurity concentration in a range from about $1 \times 10^{15}$ $cm^{-3}$ to about $1 \times 10^{18}$ $cm^{-3}$. In other embodiments, the substrate is an n-type silicon substrate with an impurity concentration in a range from about $1 \times 10^{15}$ $cm^{-3}$ to about $1 \times 10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP, or any other suitable semiconductor material; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), SiO, SiON, SiOCN and/or fluorine-doped silicate glass (FSG), or any other suitable dielectric material.

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. The ILD layer 370 includes one or more layers of silicon oxide, SiOC, SiOCN or SiCN or other low-k materials, or porous materials, or any other suitable dielectric material. After a planarization operation, the dummy gate structure is removed so as to make a gate space. Then, in the gate space, a metal gate structure 330 including a metal gate electrode and a gate dielectric layer, such as a high-k dielectric layer, is formed.

Further, in some embodiments, the cap insulating layer 340 is formed over the metal gate structure 330, so as to obtain the Fin FET structure shown in FIG. 1C.

In FIG. 1C, parts of the metal gate structure 330, the cap isolation layer 340, sidewalls 330 and the ILD 370 are cut to show the underlying structure. In some embodiments, the adjacent source/drain epitaxial regions 360 are merged with each other, and a silicide layer is formed on the merged source/drain regions.

The metal gate structure 330, the cap isolation layer 340, sidewalls 330, source/drain 360 and the ILD 370 of FIG. 1C substantially correspond to the metal gate structures 10, cap insulating layers 20 (see, FIG. 2A), sidewall spacers 30, source/drain regions 50 and first interlayer dielectric layer (ILD) 40, of FIGS. 1A, 1B and 2A, respectively.

FIGS. 2A-7E show various stages of a sequential semiconductor device fabrication process according to one embodiment of the present disclosure. In FIGS. 2A-7E, the "A" figures (FIGS. 2A, 3A, . . . ) show cross sectional view corresponding to line X1-X1 of FIG. 1A, and the "B" figures (FIGS. 2B, 3B, . . . ) show cross sectional views corresponding to line Y1-Y1 of FIG. 1A. It is understood that additional operations can be provided before, during, and after processes shown by FIGS. 2A-7E, and some of the operations described below can be replaced or eliminated for additional embodiments of the method. The order of the operations/processes may be interchangeable.

In FIGS. 2A and 2B, cap insulating layers 20 are disposed over the metal gate structures 10, respectively.

The thickness of the metal gate structures 10 from the upper surface of the high-k dielectric layer 12 to the bottom of the cap insulating layer 20 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. In some embodiments, the cap insulating layer 20 is disposed over the sidewall spacers 30, and in other embodiments, the sidewall spacers 30 are disposed on sidewalls of the cap insulating layer 20.

Further, as shown in FIGS. 2A and 2B, before forming the ILD layer 40, a bottom contact etch stop layer (B-CESL) 33 is formed over the gate structure and the S/D epitaxial regions 50. The film thickness of the B-CESL 33 is in a range from about 1 nm to about 20 nm in some embodiments.

The cap insulating layer 20 includes one or more layers of insulating material such as silicon nitride based material including SiN, SiON, SiCN and SiOCN, or any other suitable dielectric material. The sidewall spacers 30 are made of a different material than the cap insulating layer 20 and include one or more layers of insulating material, such as a silicon nitride based material including SiN, SiON, SiCN and SiOCN, or any other suitable dielectric material. The B-CESL 33 is made of a different material than the cap insulating layer 20 and the sidewall spacers 30, and includes one or more layers of insulating material, such as a silicon nitride based material including SiN, SiON, SiCN and SiOCN, or any other suitable dielectric material. The first ILD layer 40 includes one or more layers of silicon oxide, SiOC, SiOCN or SiCN or other low-k materials, or porous materials, or any other suitable dielectric material. The first ILD layer 40 can be formed by LPCVD (low pressure chemical vapor deposition), plasma-CVD, flowable CVD or other suitable film forming methods.

The material of the B-CESL 33, the sidewall spacer 30, the material of the cap insulating layer 20, and a material of the first ILD layer 40 may be different from each other, so that each of these layers can be selectively etched. In some embodiments, the B-CESL 33 is made of SiN or SiCN; the sidewall spacer 30 is made of $SiO_2$, SiOCN, SiCN or SiON; the cap insulating layer 20 is made of SiN or SiON; and the first ILD 40 layer is made of $SiO_2$.

Figure 3A:
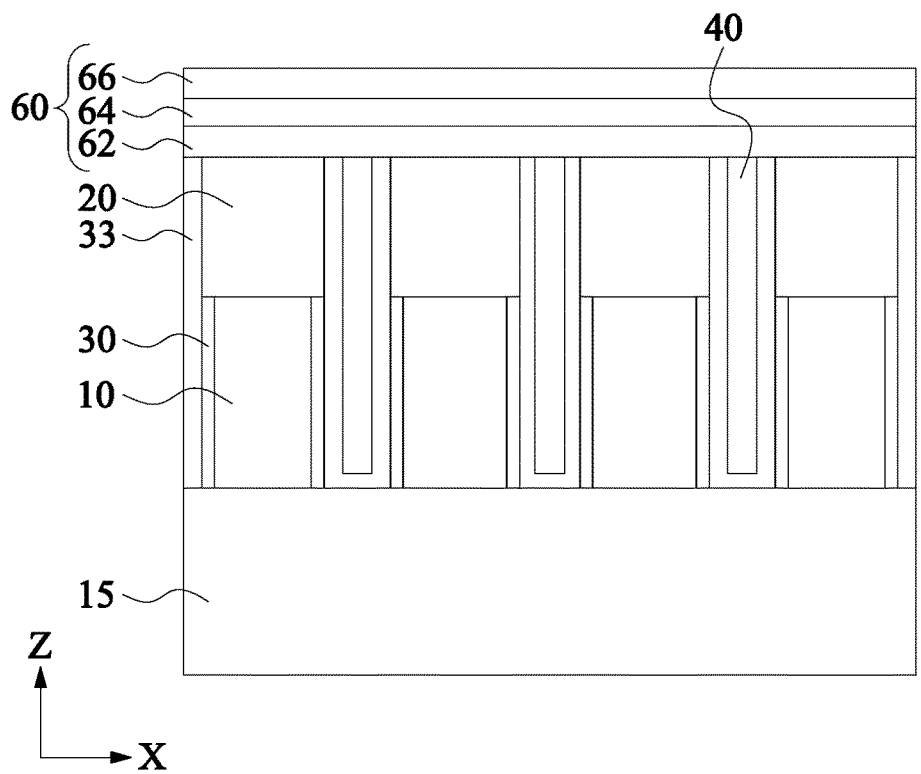
FIG. 3A shows one of the various stages of a sequential manufacturing operation for a semiconductor device according to embodiments of the present disclosure.
Figure 3B:
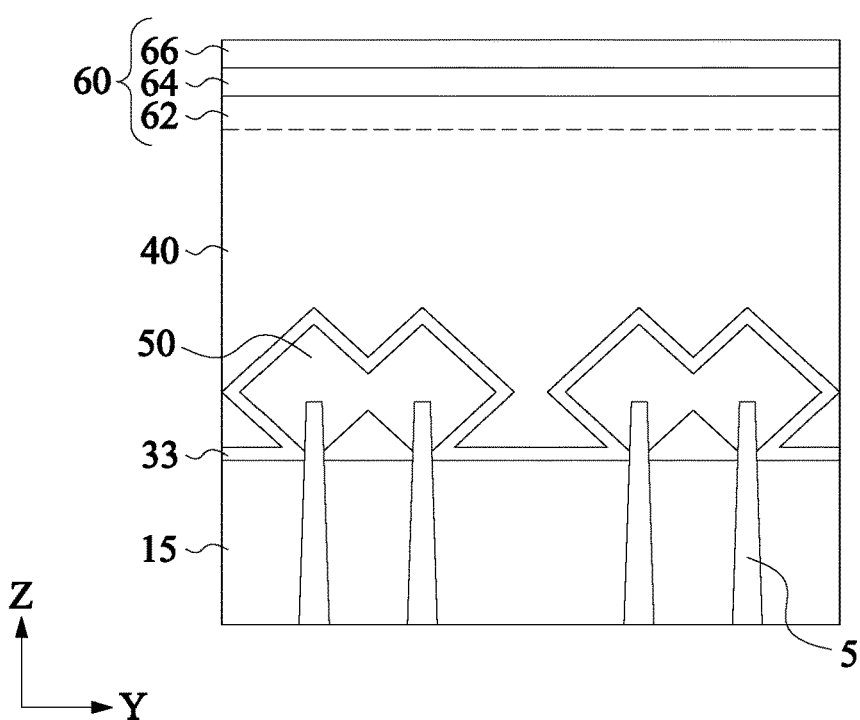
FIG. 3B shows one of the various stages of a sequential manufacturing operation for a semiconductor device according to embodiments of the present disclosure.

Subsequently, as shown in FIGS. 3A and 3B, a mask layer 60 is formed over the structure of FIGS. 2A and 2B. The mask layer 60 can be a single layer or multiple layers, and can include a resist layer, a dielectric layer, a conductive layer, a metal layer and/or a poly or amorphous layer (e.g., poly/amorphous Si). In some embodiments, the mask layer 60 includes a lower dielectric layer 62, a middle layer 64 and an upper dielectric layer 66. In certain embodiments, the lower layer 62 is a silicon oxide layer, the middle layer 64 is a TiN layer and the upper layer 66 is a silicon oxide layer. Each layer of the mask layer 60 can be formed by CVD, physical vapor deposition (PVD) including sputtering, or atomic layer deposition (ALD) or any other suitable film forming methods.

Figure 4A:
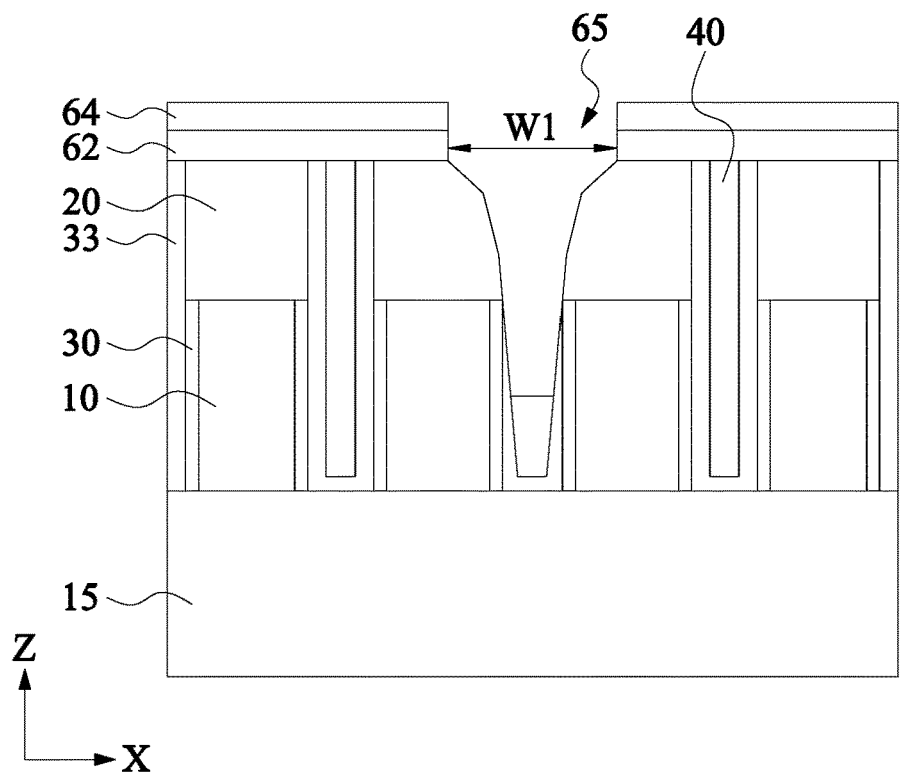
FIG. 4A shows one of the various stages of a sequential manufacturing operation for a semiconductor device according to embodiments of the present disclosure.
Figure 4B:
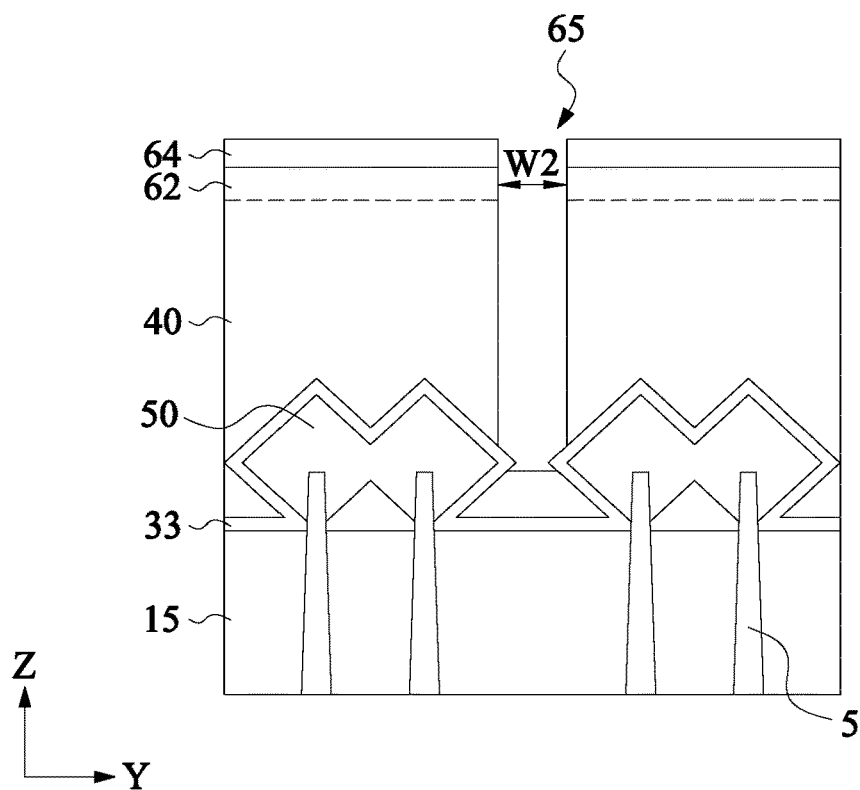
FIG. 4B shows one of the various stages of a sequential manufacturing operation for a semiconductor device according to embodiments of the present disclosure.

Then, as shown in FIGS. 4A and 4B, by using lithography and etching operations, the upper layer 66 is patterned, and by using the patterned upper layer 66, the middle layer 64 is patterned. Further, by using the patterned middle layer 64 as an etching mask, the lower layer 62 and the ILD layer 40 are patterned, thereby forming an opening 65. The width W1 of the opening 65 in the X direction is equal to or greater than a distance between the adjacent metal gate structures 10. The width W2 of the opening 65 in the Y direction is equal to or smaller than a distance between the adjacent S/D epitaxial regions 50.

Figure 4C:
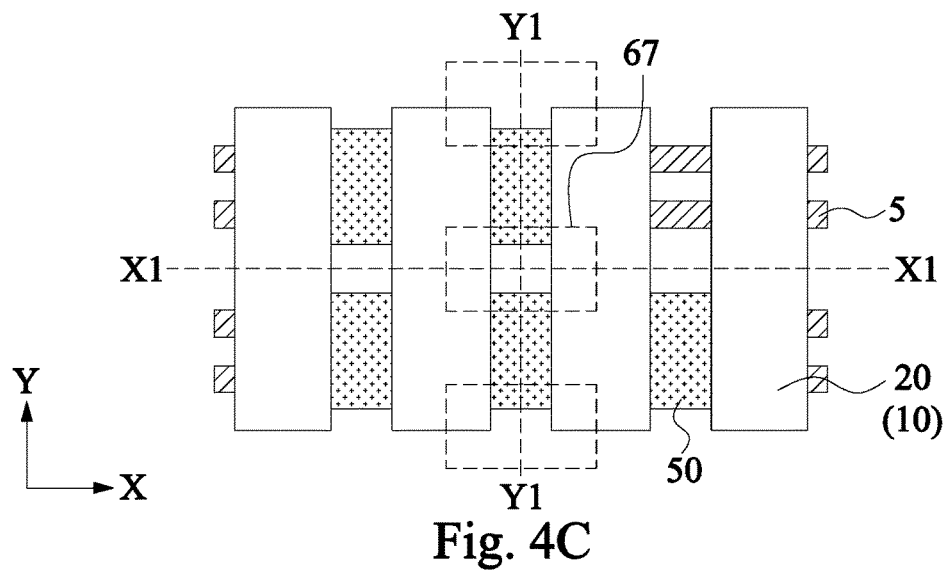
FIG. 4C shows one of the various stages of a sequential manufacturing operation for a semiconductor device according to embodiments of the present disclosure.
Figure 4D:
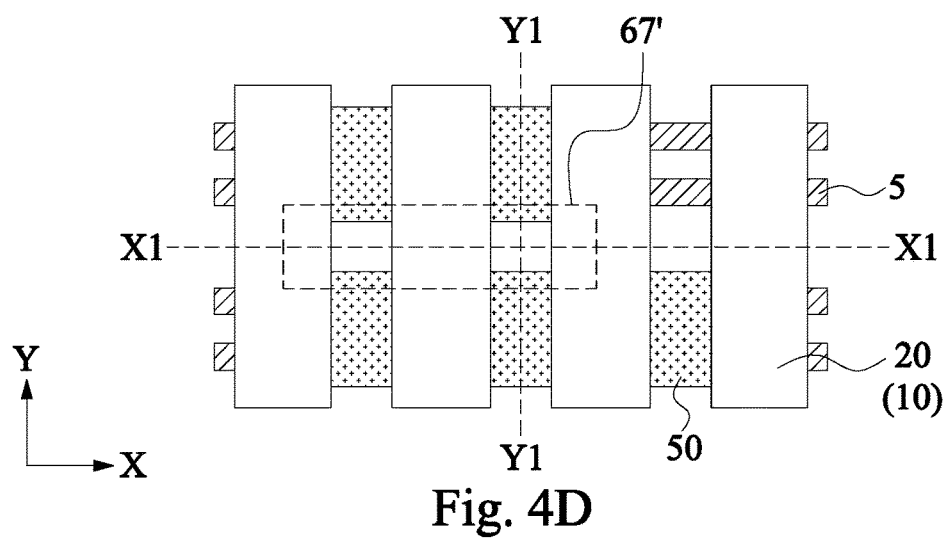
FIG. 4D shows one of the various stages of a sequential manufacturing operation for a semiconductor device according to embodiments of the present disclosure.
Figure 4E:
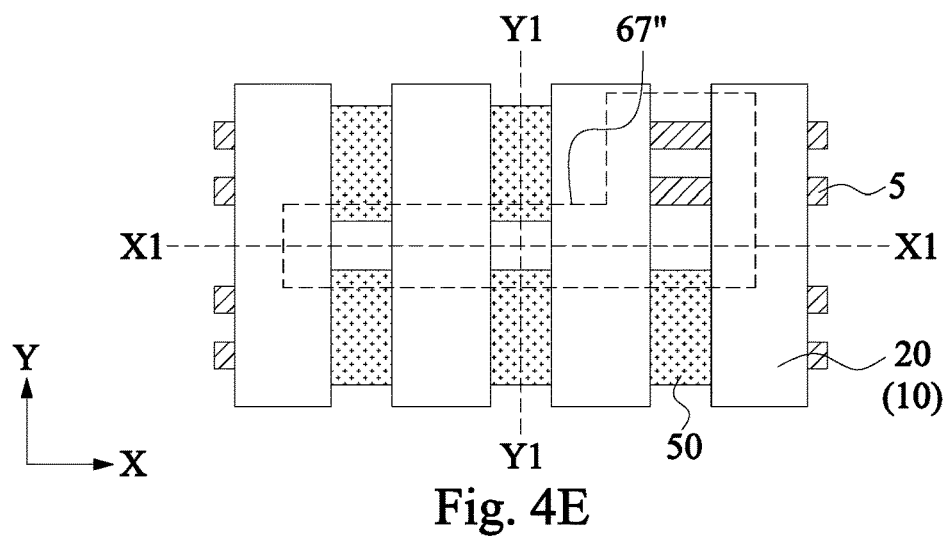
FIG. 4E shows one of the various stages of a sequential manufacturing operation for a semiconductor device according to embodiments of the present disclosure.

FIGS. 4C-4E are plan views illustrating a mask opening pattern 67 for making the opening 65 by the lithography operation. In FIG. 4C, which substantially corresponding to the embodiments explained with FIGS. 2A-7E, three mask opening patterns 67 are disposed to partially overlap the S/D epitaxial regions 50 and the metal gate structures 10, respectively. In other embodiments, as shown in FIG. 4D, the mask opening pattern 67' is disposed to overlap two spaces between the adjacent gate structures 10 and the S/D epitaxial regions 50. In other embodiments, as shown in FIG. 4E, the mask opening pattern 67" is disposed to also cover an area where the S/D epitaxial region is not formed on the fin structure 5. More than one opening patterns 67, 67' and/or 67" may be used together in some embodiments.

During the etching of the ILD layer 40, the upper and/or side portions of the cap insulating layer 20 are also etched, resulting in a V-shaped opening extending in the Z direction near the top of the opening 65. In some embodiments, the sidewall spacers 30 and/or the B-CESL 33 are also partially etched.

In some embodiments, as shown in FIG. 4B, the etching of the ILD layer 40 substantially stops at the B-CESL 33 covering the S/D epitaxial layers 50. In particular, when the space between adjacent S/D epitaxial layers 50 is small, the etching stops at the B-CESL 33. In such a case, a portion of the ILD layer 40 remains at the bottom of the opening 65. When the space between adjacent S/D epitaxial layers 50 is large, the etching continues and stops at the B-CESL 33 disposed on the isolation insulating layer 15, in some embodiments. In other embodiments, no ILD layer 40 remains between a subsequently formed dielectric filling layer 70 and the isolation insulating layer 15.

Figure 5A:
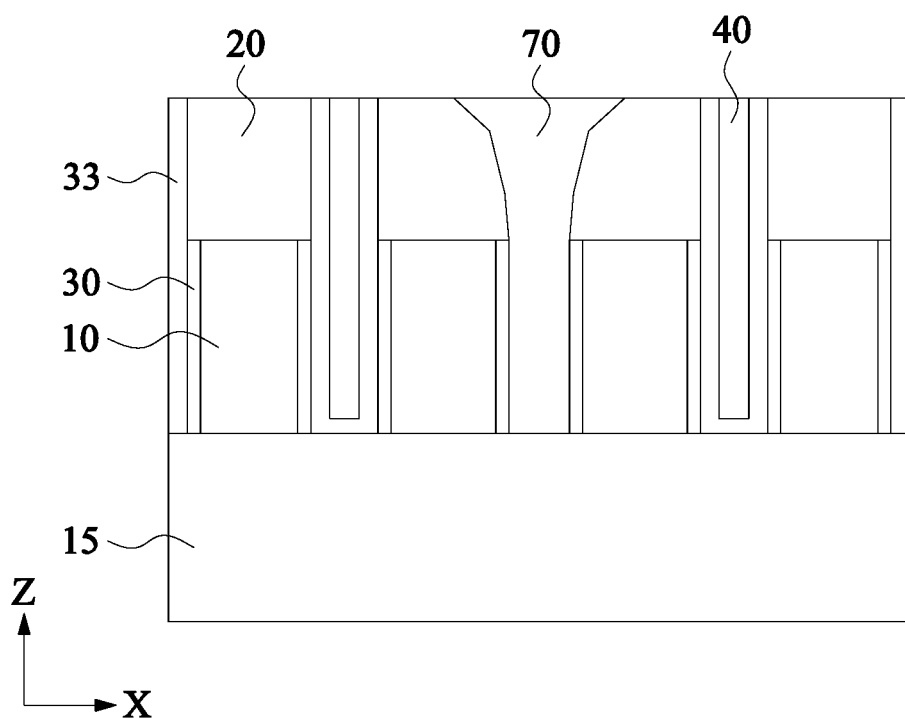
FIG. 5A shows one of the various stages of a sequential manufacturing operation for a semiconductor device according to embodiments of the present disclosure.
Figure 5B:
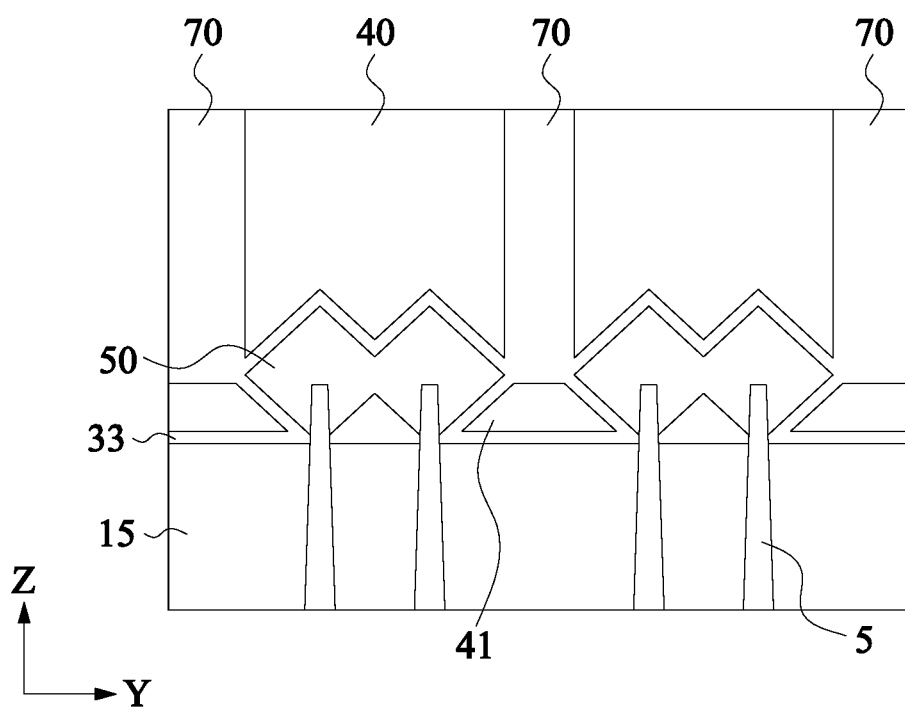
FIG. 5B shows one of the various stages of a sequential manufacturing operation for a semiconductor device according to embodiments of the present disclosure.

Then, as shown in FIGS. 5A and 5B, a dielectric filling layer 70 is formed in the opening 65. The dielectric filling layer 70 is made of, for example, SiN or SiCN, which has a high etching selectivity (more than about 10 or about 100) against $SiO_2$ in dilute HF wet etching.

The dielectric filling layer 70 may be formed by CVD, PVD including sputtering, or ALD, or any other suitable film forming methods. A planarization operation, such as chemical mechanical polishing (CMP), is performed to remove excess material over the ILD 40. As shown in FIGS. 5A and 5B, the dielectric filling layer 70 compensates the etched cap insulating layer 20. If the sidewall spacers 30 and/or the B-CESL 33 are also etched in the ILD etching, the dielectric filling layer 70 can compensate the etched sidewall spacers 30 and/or B-CESL 33.

As shown in FIG. 5B, as set forth above, when the space between adjacent S/D epitaxial layers 50 is small, a portion of the ILD layer 41 remains at the bottom of the dielectric filling layer 70.

Figure 6A:
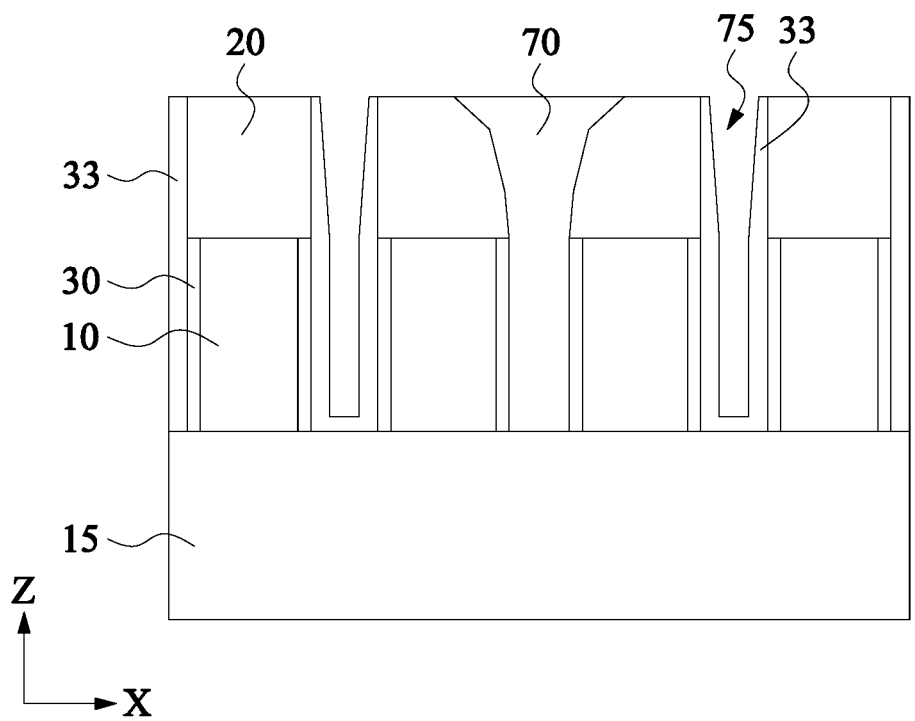
FIG. 6A shows one of the various stages of a sequential manufacturing operation for a semiconductor device according to embodiments of the present disclosure.
Figure 6B:
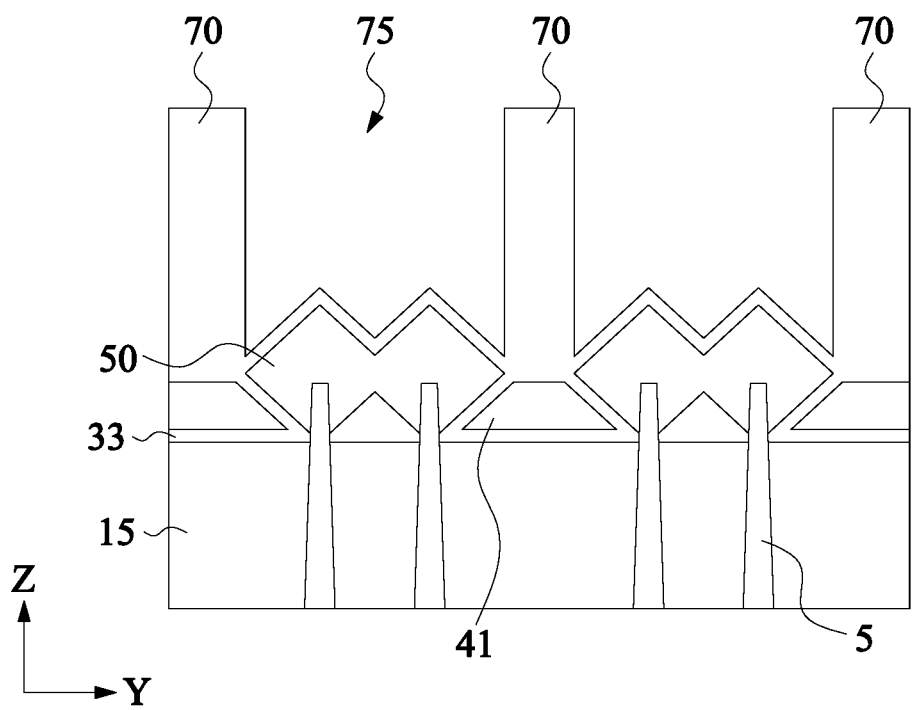
FIG. 6B shows one of the various stages of a sequential manufacturing operation for a semiconductor device according to embodiments of the present disclosure.

Then, as shown in FIGS. 6A and 6B, the ILD layer 40 is removed by using wet etching. The etching solution is dilute HF (DHF) in some embodiments. The concentration of HF in DHF is about 1 wt % in some embodiments. Unlike dry etching, no polymer is formed by DHF wet etching. Therefore, DHF wet etching can remove the first ILD layer 40 even in small spaces/areas.

In the present embodiments, the ILD layer 40 is made of $SiO_2$ or a silicon oxide based material, while the gate cap layer 20, B-CESL 33 and the dielectric filling layer 70 are made of SiN or SiCN. The etching selectivity against 1 wt %-DHF between $SiO_2$ and SiN is about 10 and the selectivity between $SiO_2$ and SiCN is about 100 or more. Accordingly, the ILD layer 40 can be fully removed by the DHF wet etching without causing damage to the gate cap layer 20, B-CESL 33 and/or the dielectric filling layer 70.

Figure 7A:
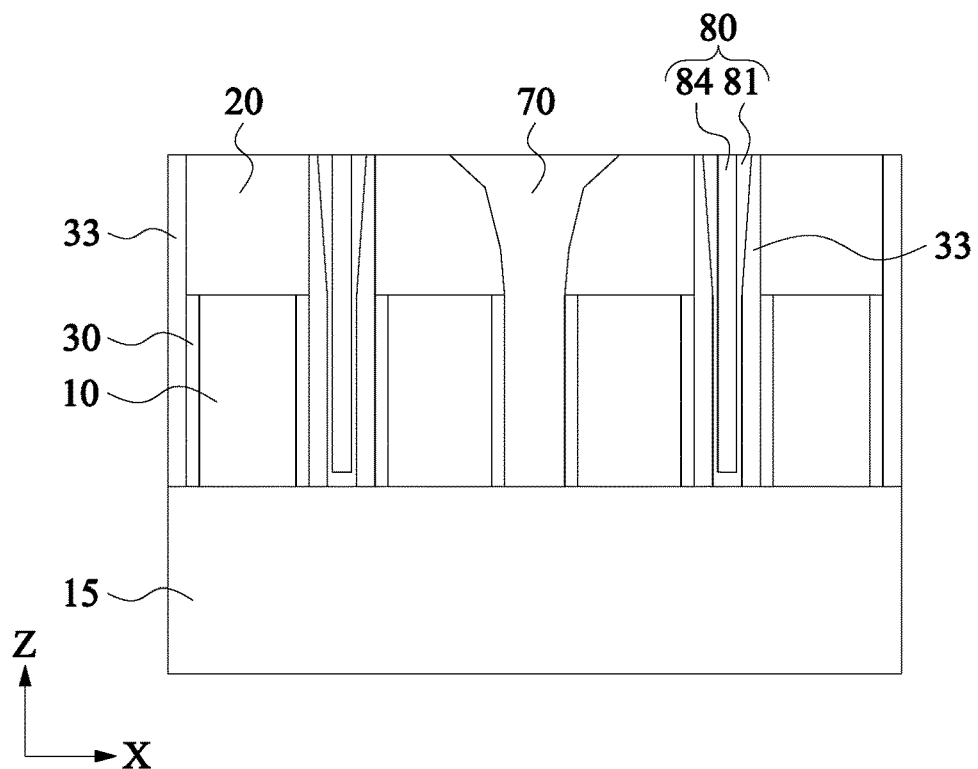
FIG. 7A shows one of the various stages of a sequential manufacturing operation for a semiconductor device according to embodiments of the present disclosure.
Figure 7B:
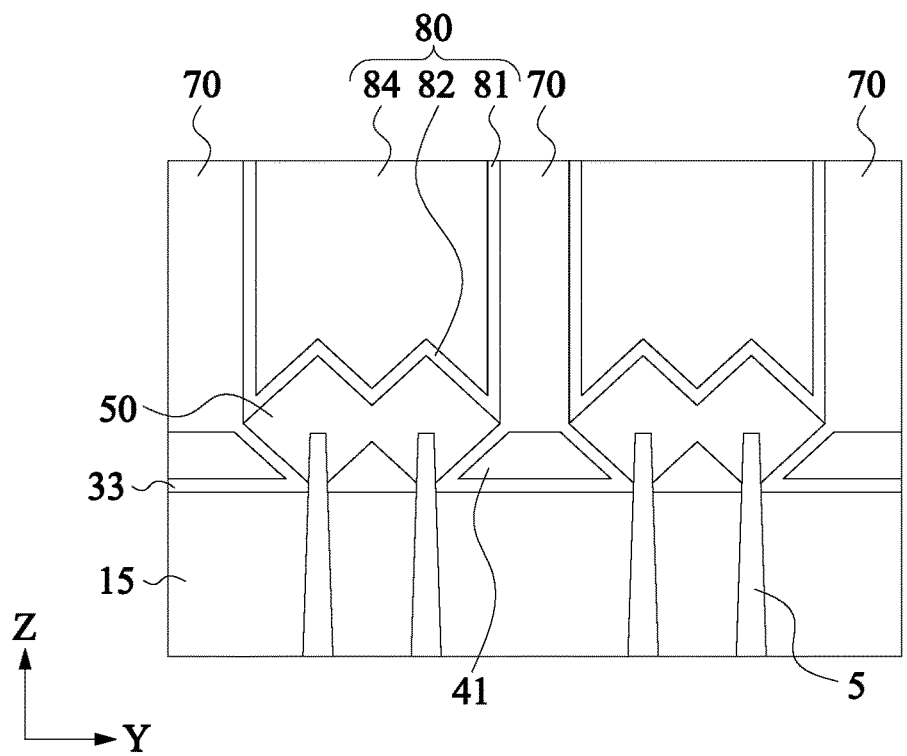
FIG. 7B shows one of the various stages of a sequential manufacturing operation for a semiconductor device according to embodiments of the present disclosure.

Next, as shown in FIGS. 7A-7E, the B-CESLs 33 disposed over the S/D epitaxial layers 50 are removed by dry etching and/or wet etching to form a contact opening, and then a metal layer 81 for silicide formation is deposited. The metal layer 81 can be formed by CVD, PVD or ALD, or any other suitable film formation methods. After the metal layer 81 is formed, a thermal operation, such as a rapid thermal annealing operation, is performed to form a silicide layer 82 from the component of the S/D epitaxial region 50 (e.g., Si) and the metal (e.g., W, Ni, Co, Ti, and/or Mo) of the metal layer 81. In some embodiments, the thermal operation is not performed because the silicide layer can be formed during the formation of the metal layer 81. As shown in FIG. 7B, the metal layer 81 remains at the side of the dielectric filling layer 70 without forming a silicide layer in some embodiments.

After the silicide layer 82 is formed, conductive material 84 is filled in the contact opening, thereby forming S/D contacts 80.

In some embodiments, the conductive material layer 84 includes a blanket layer of an adhesive (glue) layer a body metal layer. The adhesive layer includes one or more layers of conductive materials. In some embodiments, the adhesive layer includes a TiN layer formed on a Ti layer. Any other suitable conductive material can be used. The thickness of each of the TiN and Ti layer is in a range from about 1 nm to about 5 nm in some embodiments. The adhesive layer can be formed by CVD, PVD, ALD, electro-plating or a combination thereof, or other suitable film forming methods. The adhesive layer is used to prevent the body metal layer from peeling off. In some embodiments, no adhesive layer is used and the body metal layer is directly formed in the contact openings. In such cases, the body metal layer is in direct contact with the silicide layers 55.

The body metal layer is one of Co, W, Mo and Cu, or any other suitable conductive material in some embodiments. In one embodiment, Cu is used as the body metal layer. The body metal layer can be formed by CVD, PVD, ALD, electro-plating or a combination thereof or other suitable film forming methods.

After the conductive material layer 84 is formed, a planarization operation, such as chemical mechanical polishing (CMP) or etch-back operations, is performed so as to remove the excess materials.

Figure 7C:
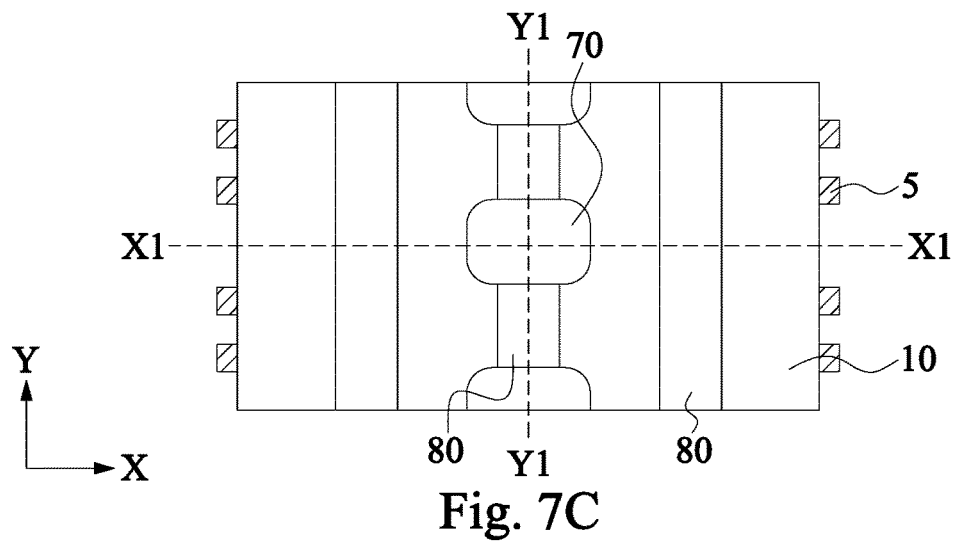
FIG. 7C shows one of the various stages of a sequential manufacturing operation for a semiconductor device according to embodiments of the present disclosure.
Figure 7D:
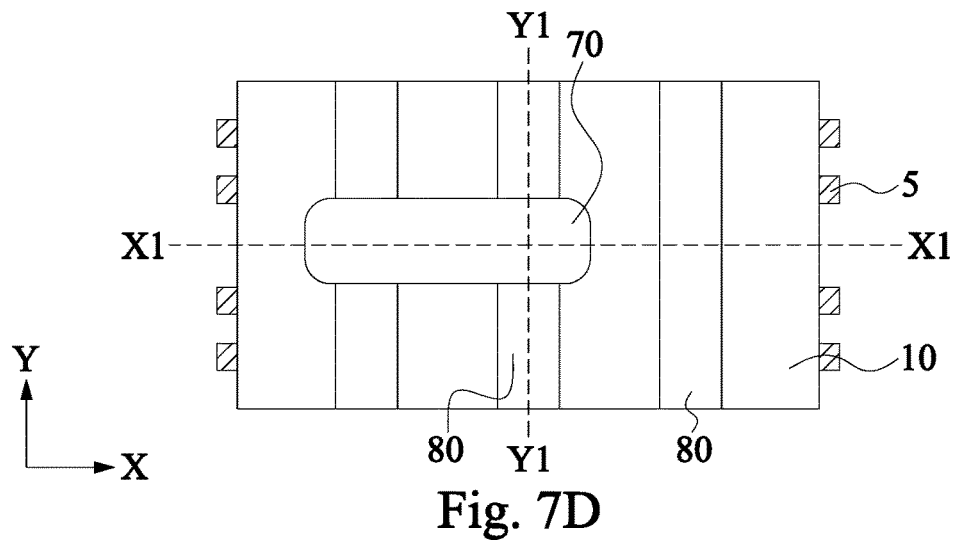
FIG. 7D shows one of the various stages of a sequential manufacturing operation for a semiconductor device according to embodiments of the present disclosure.
Figure 7E:
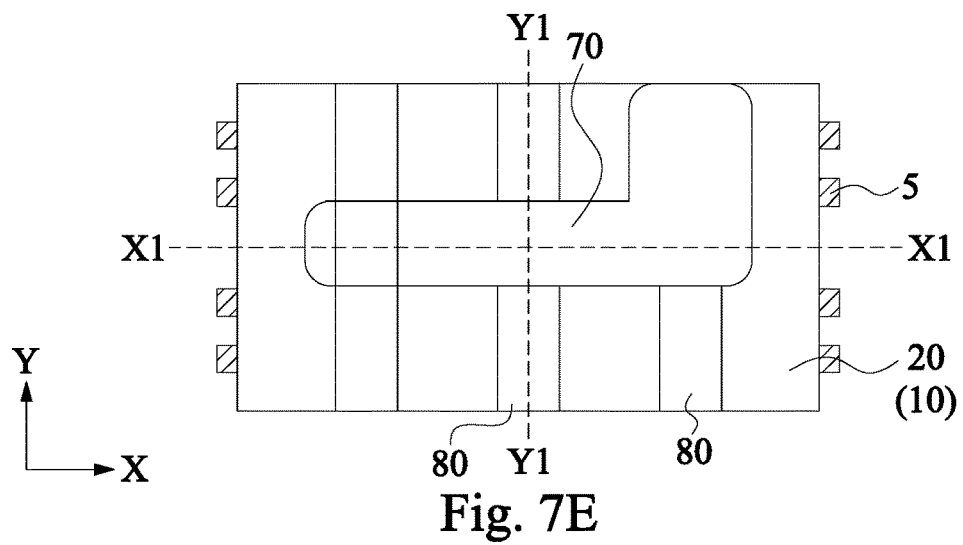
FIG. 7E shows one of the various stages of a sequential manufacturing operation for a semiconductor device according to embodiments of the present disclosure.

FIGS. 7C-7E show plan views corresponding to FIGS. 4C-4E, respectively. The dielectric filling layer 70 separates adjacent S/D contact 80 along the Y direction. As shown in FIGS. 7B-7E, the dielectric filling layer 70 has a bar shape, an island shape or an L-shape in plan view. In other embodiments, the dielectric filling layer 70 has a T-shape or an H-shape in plan view. The dielectric filling layer 70 can separate (physically and electrically) a pair of the S/D contacts 80 arranged along Y direction, and also can cover the portion where an S/D contact 80 should not be formed. For example, the dielectric filling layer 70 is disposed over a space between the adjacent two S/D epitaxial layers and/or a fin structure on which no S/D epitaxial layer is formed.

It is understood that the device shown in FIGS. 7A-7E undergoes further CMOS processes to form various features such as interconnect metal layers, dielectric layers, passivation layers, etc.

Figure 7F:
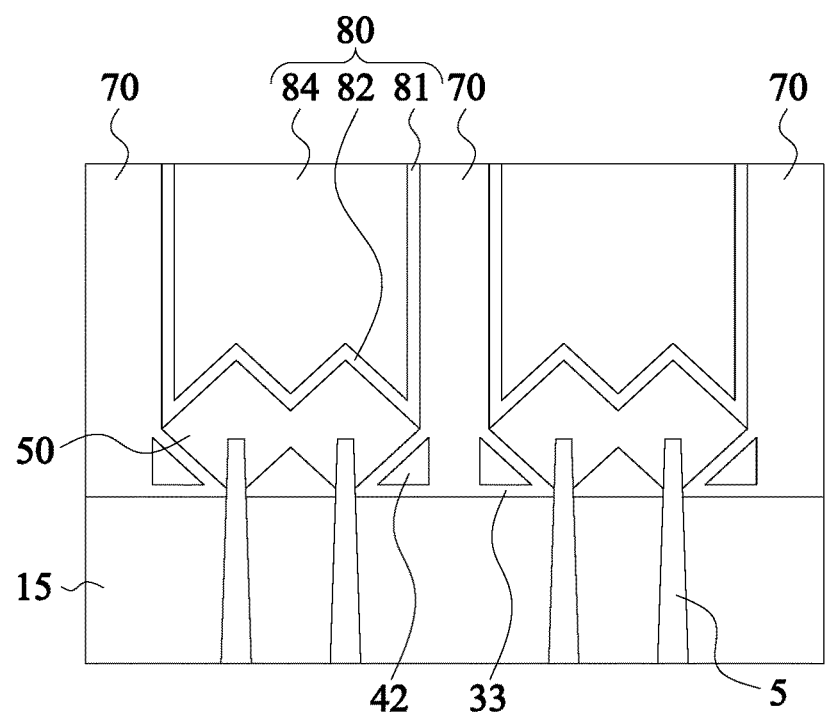
FIG. 7F shows a cross sectional view of a semiconductor device according to other embodiments of the present disclosure.
Figure 7G:
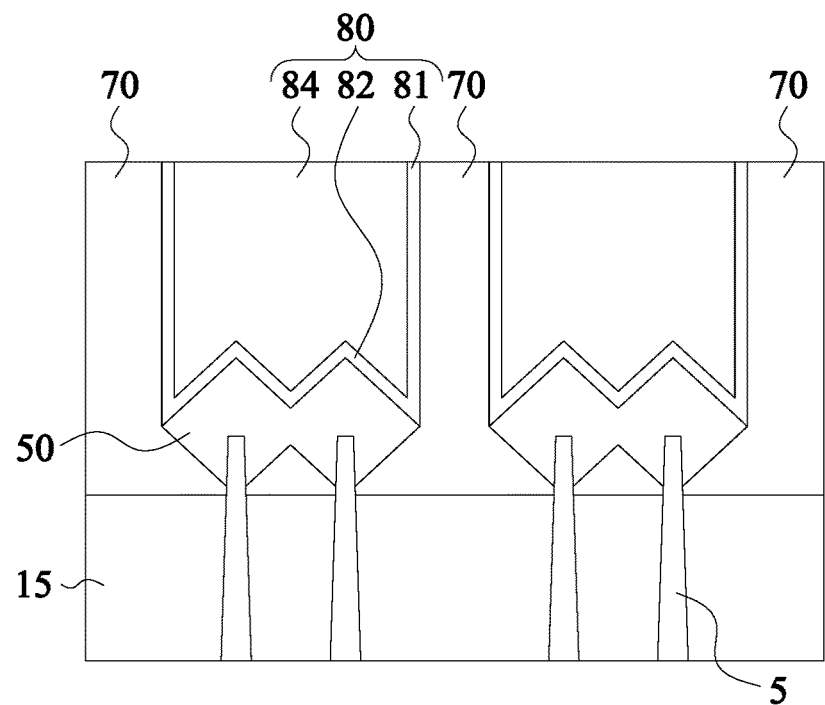
FIG. 7G shows a cross sectional view of a semiconductor device according to other embodiments of the present disclosure.

FIGS. 7F and 7G show cross sectional views of a semiconductor device according to other embodiments of the present disclosure.

As set forth above, the etching operation for forming the opening 65 may stops at a different layer and a part of the ILD layer 40 may or may not remain between a subsequently formed dielectric filling layer 70 and the isolation insulating layer 15.

For example, in FIG. 7F, a part 42 of the ILD layer 40 remains at portions under the S/D epitaxial layer 50, while the dielectric filling layer 70 is in direct contact with the B-CESL 33. In FIG. 7G, the ILD layer 40 between two adjacent S/D epitaxial layer 50 are completely removed by the etching for making the opening 65, and the dielectric filling layer 70 completely fills the portions under the S/D epitaxial layer 50 and is in direct contact with the S/D epitaxial layers 50 and the B-CESL 33.

The various embodiments or examples described herein offer several advantages over the existing art. For example, by using wet etching, it is possible to remove the ILD material ($SiO_2$) from a small space, such as a deep contact hole having a diameter about 10 nm or less. Further, the loss caused by etching of the cap insulating layer of metal gate can be repaired by a dielectric filling layer, it is possible to increase electrical separation (insulating) around the metal gates.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, an interlayer dielectric (ILD) layer is formed over an underlying structure. The underlying structure includes gate structures, each having a metal gate and a cap insulating layer disposed over the metal gate, source/drain epitaxial layers disposed between two adjacent gate structures, and an etching-stop layer (ESL) covering the source/drain epitaxial layers. An opening is formed in the ILD layer by etching. A dielectric filling layer is formed in the opening. By using wet etching, the ILD layer disposed above the source/drain epitaxial layers is removed. The ESL disposed on the source/drain epitaxial layers is removed, thereby at least partially exposing the source/drain epitaxial layers. A conductive material is formed over the exposed source/drain epitaxial layers.

In another aspect of the present disclosure, in a method of manufacturing a semiconductor device, an interlayer dielectric (ILD) layer is formed over an underlying structure. The underlying structure includes first to fourth gate structures, each having a metal gate, sidewall spacers disposed on opposing sides of the metal gate and a cap insulating layer disposed over the metal gate, where the first to fourth gate structures are arranged in this order along a first direction. The underlying structure further includes a first source/drain (S/D) epitaxial layer and a second S/D epitaxial layer, both disposed between the second gate structure and the third gate structure, and an etching-stop layer (ESL) covering the first and second S/D epitaxial layers. A first opening is formed in the ILD layer by etching over an area including a region between the first and second S/D epitaxial layer. A dielectric filling layer is formed in the first opening. By using wet etching, the ILD layer disposed above the first and second S/D epitaxial layers is removed, thereby forming a second opening and a third opening, respectively, and the ILD layer disposed between the first gate structure and the second gate structure is removed, thereby forming a fourth opening. The ESL disposed on the first and second S/D epitaxial layers is removed, thereby at least partially exposing the first and second S/D epitaxial layers. A conductive material is formed over the exposed first and second S/D epitaxial layers, thereby forming a first S/D contact on the first S/D epitaxial layer and a second S/D contact on the second S/D epitaxial layer, and in the fourth opening, thereby forming a contact bar.

In another aspect of the present disclosure, a semiconductor device includes: an isolation insulating layer; fin structures protruding from the isolation insulating layer; gate structures, each having a metal gate and a cap insulating layer disposed over the metal gate; a first source/drain epitaxial layer and a second source/drain epitaxial layer disposed between two adjacent gate structures; and a first conductive contact disposed on the first source/drain epitaxial layer, and a second conductive contact disposed on the second source/drain epitaxial layer; a separation isolation region disposed between the first and second conductive contact; and an insulating layer disposed between the separation isolation region and the isolation insulating layer. The separation isolation region is made of a different material than the insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an isolation insulating layer;
   fin structures protruding from the isolation insulating layer, the fin structures extending in a first direction and arranged in a second direction crossing the first direction;
   gate structures extending in the second direction and arranged in the first direction, each having a metal gate and a cap insulating layer disposed over the metal gate;
   a first source/drain epitaxial layer and a second source/drain epitaxial layer, both of which are disposed between two adjacent gate structures;
   a first conductive contact disposed on the first source/drain epitaxial layer, and a second conductive contact disposed on the second source/drain epitaxial layer;
   a separation isolation layer disposed between the first and second conductive contacts in the second direction; and
   a dielectric layer disposed between the separation isolation layer and the isolation insulating layer and between the first and second source/drain epitaxial layers,
   wherein the separation isolation layer is made of a different material than the dielectric layer.

2. The semiconductor device of claim 1, wherein the separation isolation layer is made of one or more layers of SiN and SiCN.

3. The semiconductor device of claim 1, wherein the dielectric layer is made of $SiO_2$.

4. The semiconductor device of claim 1, further comprising a liner insulating layer disposed between the dielectric layer and the isolation insulating layer and made of a different material than the dielectric layer.

5. The semiconductor device of claim 4, wherein materials of the liner insulating layer, the cap insulating layer and the separation isolation layer are different from a material of the dielectric layer.

6. The semiconductor device of claim 4, wherein the liner insulating layer is made of at least one selected from the group consisting of SiN and SiCN.

7. The semiconductor device of claim 4, wherein the cap insulating layer is made of at least one selected from the group consisting of SiN and SiON.

8. The semiconductor device of claim 4, wherein the liner insulating layer is made of a same material as the separation isolation layer.

9. The semiconductor device of claim 1, wherein the dielectric layer is located below a level at which a distance between the first source/drain epitaxial layer and the second source/drain epitaxial layer is minimum.

10. The semiconductor device of claim 1, wherein two dielectric layers separated by a part of the separation isolation layer are provided between the first and second source/drain epitaxial layers.

11. A semiconductor device, comprising:
an isolation insulating layer;
a first pair of fin structures and a second pair of fin structures, both protruding from the isolation insulating layer;
a first gate structure and a second gate structure, each disposed over the first and second pairs of fin structures and each having a metal gate and a cap insulating layer disposed over the metal gate;
a first source/drain epitaxial layer disposed over a region of the first pair of fin structures between the first and second gate structure, and a second source/drain epitaxial layer disposed over a region of the second pair of fin structures between the first and second gate structures;
a first conductive contact disposed on the first source/drain epitaxial layer, and a second conductive contact disposed on the second source/drain epitaxial layer;
a separation isolation layer disposed between the first and second conductive contacts; and
a dielectric layer disposed between the separation isolation layer and the isolation insulating layer and between the first and second source/drain epitaxial layers,
wherein the dielectric layer is made of a different material than the separation isolation layer and the cap insulating layer.

12. The semiconductor device of claim 11, wherein each of the first and second gate structures includes sidewall spacers disposed on opposing side faces of the metal gate.

13. The semiconductor device of claim 12, further comprising a liner insulating layer disposed between the dielectric layer and the isolation insulating layer.

14. The semiconductor device of claim 13, wherein materials for the liner insulating layer, the sidewall spacers, the cap insulating layer and the isolation separation layer are different from a material of the dielectric layer.

15. The semiconductor device of claim 14, wherein:
the liner insulating layer is made of at least one selected from the group consisting of SiN and SiCN,
the cap insulating layer is made of at least one selected from the group consisting of SiN and SiON,
the sidewall spacers are made of at least one selected from the group consisting of SiCN and SiOCN,
the separation isolation layer is made of at least one selected from the group consisting of SiN and SiCN, and
the dielectric layer is made of $SiO_2$.

16. The semiconductor device of claim 11, wherein:
a space is formed between the first source/drain epitaxial layer and the isolation insulating layer between the first pair of fin structures, and
the space is filled with a same material as the dielectric layer.

17. The semiconductor device of claim 11, wherein the separation isolation layer is in contact with the cap insulating layer and one of the sidewall spacers of the first gate structure and the cap insulating layer and one of the sidewall spacers of the second gate structure.

18. The semiconductor device of claim 11, wherein a width of the separation isolation insulating layer in contact with the sidewall spacers is smaller than a width of the separation isolation insulating layer in contact with the cap insulating layers.

19. The semiconductor device of claim 11, wherein:
the first and second fin structures extend in a first direction and are arranged in a second direction crossing the first direction,
the first and second gate structures extends in the second direction and are arranged in the first direction, and
the first separation isolation layer is disposed between the first and second conductive contacts in the second direction.

20. A semiconductor device, comprising:
an isolation insulating layer;
fin structures protruding from the isolation insulating layer, the fin structures extending in a first direction and arranged in a second direction crossing the first direction;
gate structures extending in the second direction and arranged in the first direction, each having a metal gate and a cap insulating layer disposed over the metal gate;
a first source/drain epitaxial layer and a second source/drain epitaxial layer, both of which are disposed between two adjacent gate structures;
a first conductive contact disposed on the first source/drain epitaxial layer, and a second conductive contact disposed on the second source/drain epitaxial layer;
a separation isolation layer disposed between the first and second conductive contacts in the second direction; and
a dielectric layer disposed between the separation isolation layer and the isolation insulating layer and between the first and second source/drain epitaxial layers,
wherein the separation isolation layer has one of an L-shape, a T-shape and an H-shape in plan view.

* * * * *